(12) United States Patent
Tsai et al.

(10) Patent No.: US 11,069,633 B2
(45) Date of Patent: Jul. 20, 2021

(54) ELECTRONIC PACKAGE

(71) Applicant: Siliconware Precision Industries Co., Ltd., Taichung (TW)

(72) Inventors: Ming-Fan Tsai, Taichung (TW);
Chih-Hsien Chiu, Taichung (TW);
Tsung-Hsien Tsai, Taichung (TW);
Chao-Ya Yang, Taichung (TW);
Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 222 days.

(21) Appl. No.: 16/028,798

(22) Filed: Jul. 6, 2018

(65) Prior Publication Data

US 2019/0214352 A1 Jul. 11, 2019

(30) Foreign Application Priority Data

Jan. 10, 2018 (TW) .................... 107100904

(51) Int. Cl.
*H01L 23/66* (2006.01)
*H01L 23/498* (2006.01)
(Continued)

(52) U.S. Cl.
CPC .............. *H01L 23/66* (2013.01); *H01L 23/04* (2013.01); *H01L 23/49838* (2013.01); *H01L 23/552* (2013.01); *H01Q 1/2283* (2013.01); *H01Q 1/243* (2013.01); *H01Q 1/526* (2013.01); *H01Q 9/42* (2013.01); *H01L 23/3121* (2013.01);
(Continued)

(58) Field of Classification Search
CPC . H01L 23/66; H01L 23/49838; H01L 23/552; H01L 23/04; H01L 2924/181; H01L 2924/00014; H01L 2224/48227; H01L 23/3121; H01L 2224/48225; H01L 2223/6677; H01L 24/48; H01L 2224/48091; H01L 2224/48106; H01L 23/498; H01L 23/3157; H01Q 9/42; H01Q 1/2283; H01Q 1/526; H01Q 1/243; H01Q 1/36; H01Q 1/50; H05K 1/185; H05K 2201/10977
See application file for complete search history.

(56) References Cited

U.S. PATENT DOCUMENTS 6,377,464 B1 * 4/2002 Hashemi ................ H01L 25/16
361/760
7,049,682 B1 * 5/2006 Mathews .............. H01L 23/552
257/660
(Continued)

*Primary Examiner* — Dameon E Levi
*Assistant Examiner* — David E Lotter
(74) *Attorney, Agent, or Firm* — Mintz Levin Cohn Ferris Glovsky and Popeo, P.C.; Peter F. Corless; Steven M. Jensen

(57) ABSTRACT

The disclosure provides an electronic package, including a carrier, an electronic component disposed on the carrier, a buffer, and an antenna structure, wherein the antenna structure includes a metal frame disposed on the carrier and a wire disposed on the carrier and electrically connected to the metal frame, and the buffer covers the wire so as to reduce the emission wave speed of the wire and thus the wavelength is shorten, thereby satisfying the length requirement of the antenna within the limited space of the carrier and achieving an operating frequency radiated as required.

12 Claims, 4 Drawing Sheets

(51) Int. Cl.
    *H01L 23/552*     (2006.01)
    *H01L 23/04*     (2006.01)
    *H01Q 1/22*     (2006.01)
    *H01Q 1/52*     (2006.01)
    *H01Q 1/24*     (2006.01)
    *H01Q 9/42*     (2006.01)
    *H01L 23/31*     (2006.01)
    *H01L 23/00*     (2006.01)

(52) U.S. Cl.
    CPC ...... *H01L 24/48* (2013.01); *H01L 2223/6677* (2013.01); *H01L 2224/48091* (2013.01); *H01L 2224/48106* (2013.01); *H01L 2224/48225* (2013.01); *H01L 2224/48227* (2013.01); *H01L 2924/00014* (2013.01); *H01L 2924/181* (2013.01)

(56) References Cited

U.S. PATENT DOCUMENTS

| | | | |
|---|---|---|---|
| 9,991,216 B2* | 6/2018 | Liao | H01L 23/49827 |
| 2009/0223046 A1* | 9/2009 | Murayama | H05K 3/4682 |
| | | | 29/847 |
| 2010/0068837 A1* | 3/2010 | Kumar | G01R 31/2601 |
| | | | 438/17 |
| 2010/0140780 A1* | 6/2010 | Huang | H01L 24/29 |
| | | | 257/690 |
| 2010/0327406 A1* | 12/2010 | Padmanathan | H01L 23/528 |
| | | | 257/531 |
| 2015/0145747 A1* | 5/2015 | Chung | H01Q 1/40 |
| | | | 343/873 |
| 2015/0313003 A1* | 10/2015 | Kasar | H05K 3/284 |
| | | | 361/749 |
| 2016/0172762 A1* | 6/2016 | Chiu | H01Q 1/38 |
| | | | 343/700 MS |
| 2017/0346185 A1* | 11/2017 | Wang | H01Q 1/2283 |

* cited by examiner

ELECTRONIC PACKAGE

CROSS-REFERENCE TO RELATED APPLICATION

This Application claims priority under 35 U.S.C. § 119(a) the benefit of Taiwanese Patent Application No. 107100904 filed on Jan. 10, 2018, the entire contents of which is incorporated herein by reference.

BACKGROUND

1. Technical Field

The present disclosure relates to electronic packages, and, more particularly, to an electronic package with an antenna structure.

2. Description of Related Art

With the rapid development in electronic industry, electronic products are trending towards features, such as multiple functions and high performance. Wireless communication technology has been widely adopted in a myriad of consumer electronic products for receiving and/or transmitting various types of wireless signals.

In order to satisfy the design requirements for consumer electronic products, wireless communication modules are designed and developed to be compact and have light weight. A patch antenna, which is characterized by its small size, lightweight and ease of manufacturing, has become popular in wireless communication modules for cell phones, personal digital assistant (PDA), and the like.

FIG. 1 is an isometric view depicting a traditional wireless communication module 1. The wireless communication module 1 includes: a substrate 10, a plurality of electronic components 11 disposed on the substrate 10, an antenna structure 12, and an encapsulant 13. The substrate 10 is a rectangular circuit board. The electronic components 11 are disposed on and electrically connected with the substrate 10. The antenna structure 12 is a patch antenna and includes an antenna body 120 and a wire 121. The antenna body 120 is electrically connected with the electronic components 11 via the wire 121. The encapsulant 13 covers the electronic components 11 and a portion of the wire 121.

However, in the traditional wireless communication module 1 the antenna structure 12 is planar, and when the operating frequency of the antenna structure 12 requires 2.44 GHz, the minimum electrical length of the antenna structure 12 has to be equal to ¼ of the wavelength. Due to the electromagnetic radiation characteristic between the antenna structure 12 and the electronic component 11 and the size limitation of the antenna structure 12, it is difficult to increase the length of the antenna body 120 and the wire 121 in the limited space of the substrate 10, therefore failing to the meet the requirement for 2.44 GHz operating frequency of the antenna structure 12.

Moreover, since the antenna structure 12 is a planar antenna, a layout area (an area not covered by the encapsulant 13) is required on the surface of the substrate 10 for forming the antenna body 120, making it difficult to reduce the width of the substrate 10, and in turn the width of the wireless communication module 1. As a result, miniaturization of the wireless communication module 1 cannot be realized.

Therefore, there is a need for a solution that addresses the aforementioned issues in the prior art.

SUMMARY

In view of the aforementioned shortcomings of the prior art, the present disclosure provides an electronic package, which may include: a carrier; at least one electronic component disposed on the carrier; an antenna structure disposed on and electrically connected with the carrier, wherein the antenna structure includes a metal frame provided upright on the carrier and a wire provided on the carrier and electrically connected with the metal frame; and a buffer covering the wire and free from being electrically connected with the antenna structure.

In an embodiment, the antenna structure is electrically connected with the carrier via the wire.

In an embodiment, the antenna structure has an operating frequency of 2.44 GHz.

In an embodiment, the metal frame includes an extending portion and at least a supporting portion, the extending portion being held over the carrier by the supporting portion. In another embodiment, the buffer is positioned between the extending portion and the wire. In yet another embodiment, the supporting portion penetrates the buffer.

In an embodiment, the buffer is an insulator. In another embodiment, the buffer is made of a dielectric material. In yet another embodiment, the dielectric material has a dielectric constant between 5 and 15.

In an embodiment, the buffer is in contact with the metal frame.

In an embodiment, the buffer covers a portion or entirety of the wire.

In an embodiment, the electronic package may further include an encapsulant formed on the carrier and covering the electronic component, the buffer, and the antenna structure.

In an embodiment, the electronic package may further include a shield structure disposed on the carrier and covering the electronic component.

As can be understood from the above, the electronic package according to the present disclosure employs the buffer to cover the wire to effectively reduce the emission wave speed of the wire. This results in a decrease in the emission wavelength. Compared to the prior art, the antenna structure of the electronic package according to the present disclosure is able to radiate at the required operating frequency under the limited space of the carrier.

Furthermore, with the higher-profile antenna structure compared to the prior art, the length of the antenna structure can be increased without costing an extra layout area on the surface of the carrier, thereby satisfying the requirements of the antenna and the need for miniaturization of the electronic package.

DETAILED DESCRIPTION OF THE EMBODIMENTS

Figure 1:
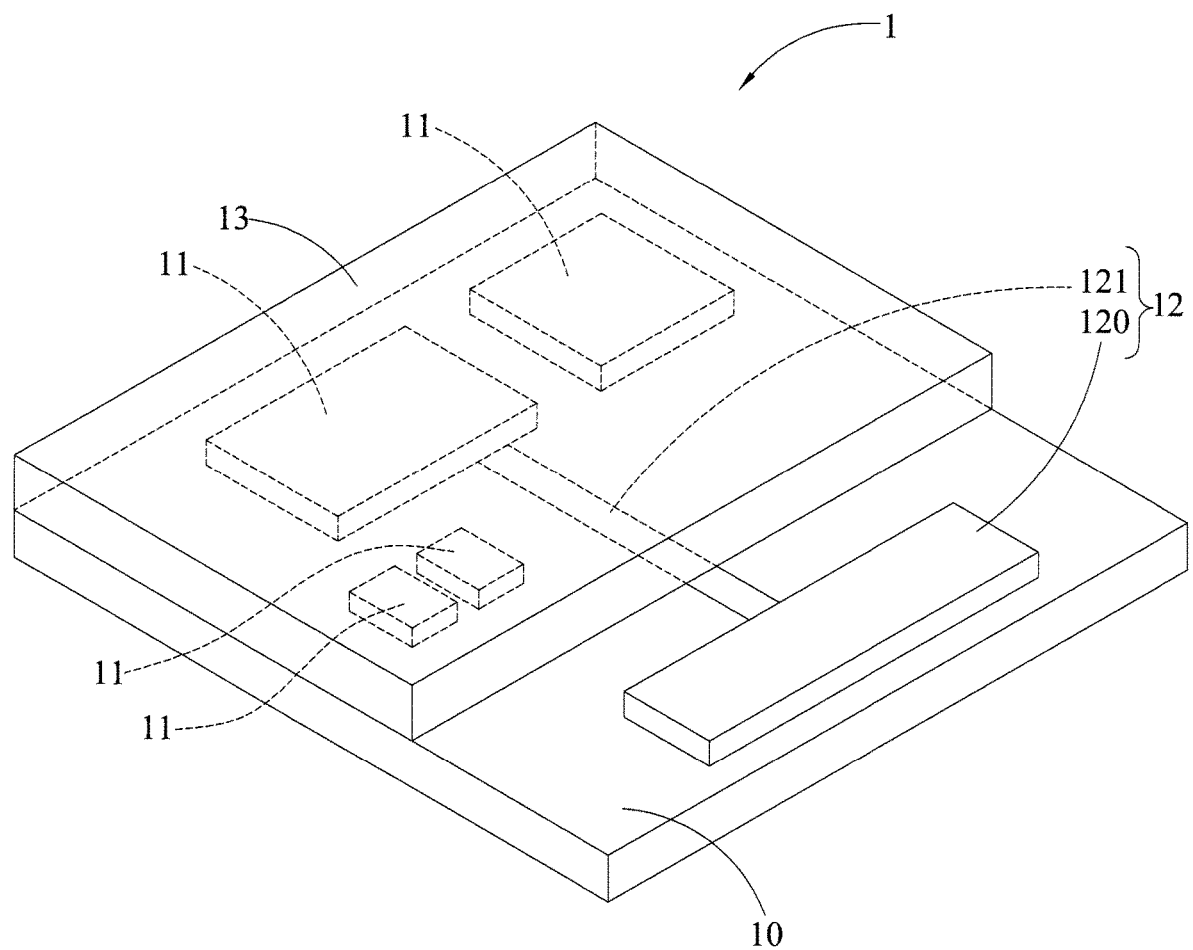
FIG. 1 is an isometric view depicting a traditional wireless communication module.

The technical content of present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "two", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
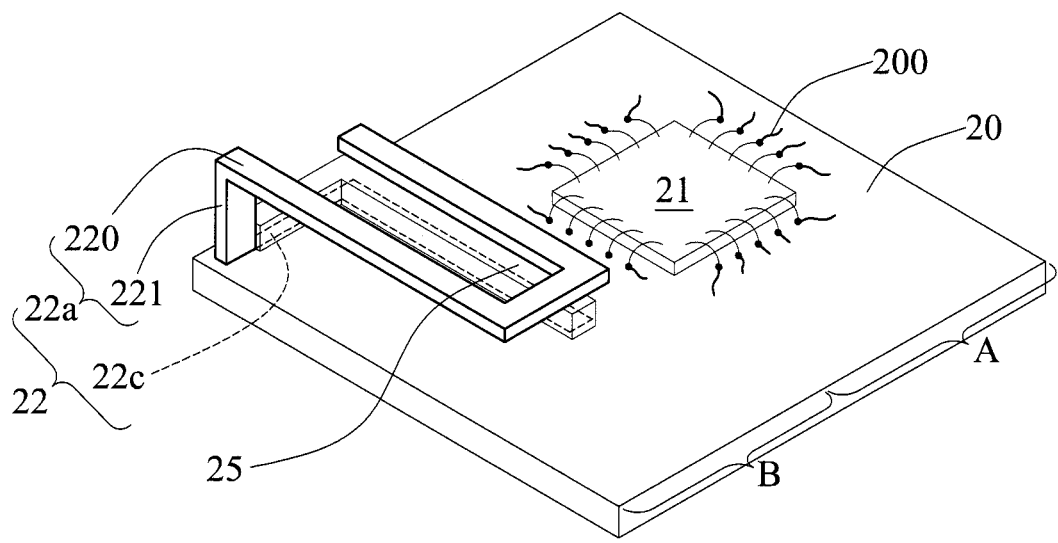
FIGS. 2A to 2C are isometric views illustrating a method for manufacturing an electronic package in accordance with the present disclosure, wherein FIG. 2C' is a cross-sectional view of FIG. 2C.
Figure 2B:
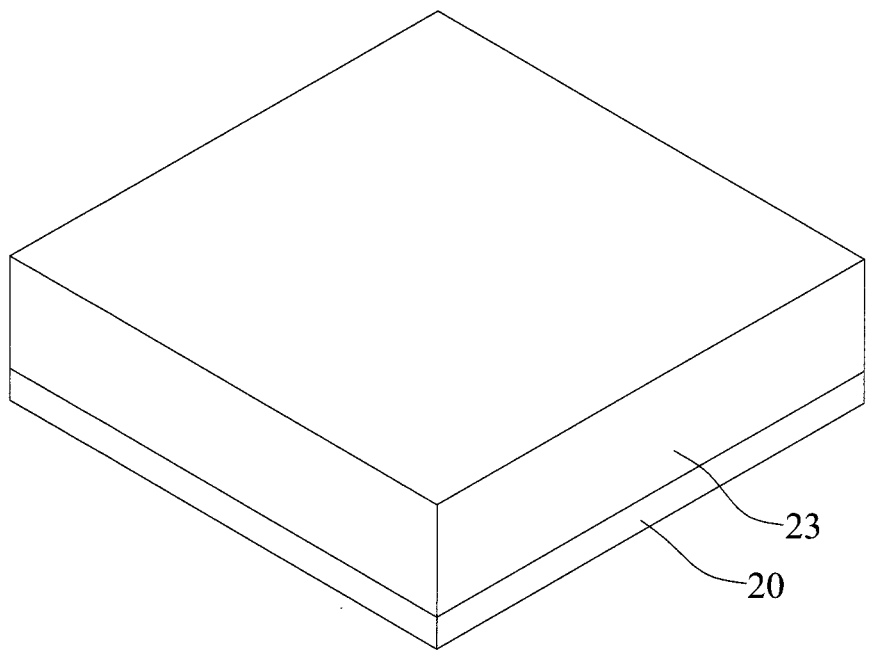
Figure 2C:
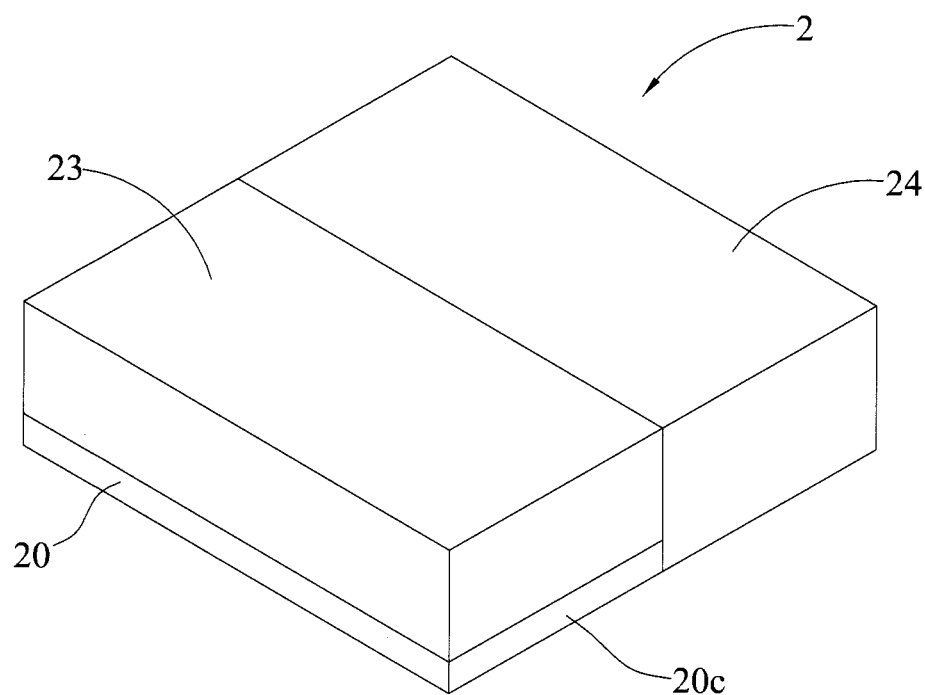
Figure 2C:
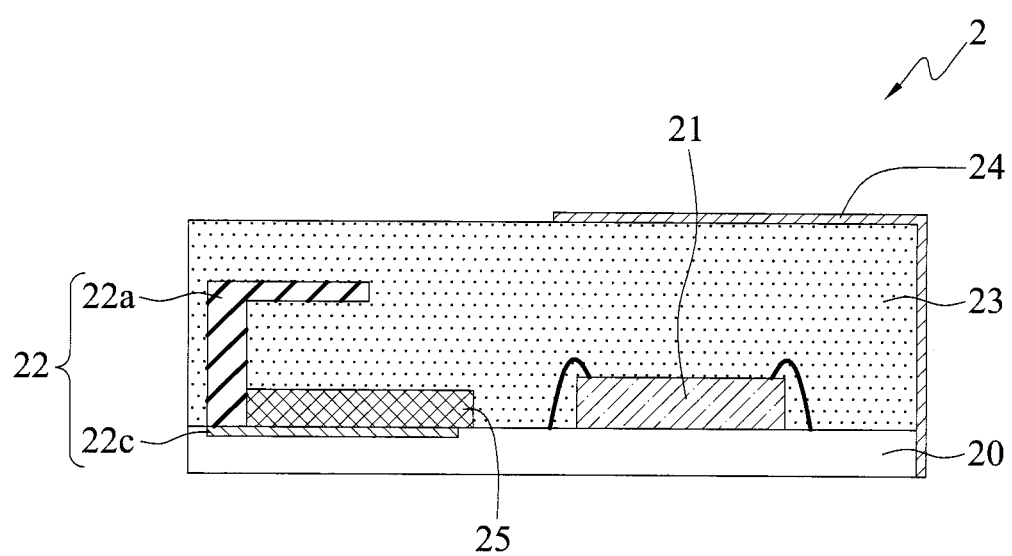

FIGS. 2A to 2C are isometric views illustrating a method for manufacturing an electronic package 2 in accordance with the present disclosure. In an embodiment, the electronic package 2 is a System in Package (SiP) wireless communication module.

As shown in FIG. 2A, at least one electronic component 21 and an antenna structure 22 are disposed on and electrically connected with a carrier 20. At least one buffer 25 is arranged on the carrier 20 at a location corresponding to the antenna structure 22.

In an embodiment, the carrier 20 is rectangular, and is defined with a first area A and a second area B adjoining each other. In an embodiment, the carrier 20 is a substrate with a core layer and circuit structures or coreless circuit structures, which is composed of a plurality of circuit structures 200 disposed on a dielectric material, for example, a fan-out redistribution layer (RDL). It can be appreciated that the carrier 20 can also be a carrier unit for carrying electronic components (e.g., chips), such as a leadframe (the leads of which are considered as the circuit structures), but the present disclosure is not limited as such.

The electronic component 21 can be an active component, a passive component or a combination thereof. In an embodiment, the active component is a semiconductor chip, and the passive component is a resistor, a capacitor or an inductor. In an embodiment, the electronic component 21 is a semiconductor chip provided on the first area A of the carrier 20. In an embodiment, the electronic component 21 is electrically connected with the circuit structures 200 by solder wires through wire bonding. In another embodiment, the electronic component 21 is disposed on and electrically connected with the circuit structures 200 via a plurality of conductive bumps (not shown) (e.g., solder materials) in a flip-chip manner, for example. In yet another embodiment, the electronic component 21 is in direct contact with the circuit structures 200. It can be appreciated that there are various ways of electrically connecting the electronic component 21 to the carrier 20, and the present disclosure is not limited as such.

The antenna structure 22 is provided on the second area B of the carrier 20, and includes a metal frame 22a and at least one wire 22c electrically connected to the metal frame 22a, such that the antenna structure 22 is electrically connected with the carrier 20 via the wire 22c.

In an embodiment, the operating frequency of the antenna structure 22 is 2.44 GHz. In another embodiment, if the wavelength can be reduced, then the electrical length of the antenna is able to satisfy the requirement of ¼ wavelength under limited space so that the antenna structure 22 can radiate an operating frequency at 2.44 GHz.

In an embodiment, the metal frame 22a is made of an iron or another material. The metal frame 22a includes an extending portion 220 and a supporting portion 221. The supporting portion 221 is provided upright on the carrier 20, and the extending portion 220 is held by the supporting portion 221 over the carrier 20, such that the extending portion 220 is higher than the electronic component 21 and the buffer 25. The extending portion 220 extends along the edge of the second area B of the carrier 20. In an embodiment, the extending portion 220 acts as the antenna body, and can be bent, for example, into the shape of a loop with an opening (e.g., like the letter "n"), the letter "L", or a closed loop. The supporting portion 221 is electrically connected with the wire 22c, and is a single column, but it can be in other shapes (e.g., a wall) or there may be a plurality of which if needed.

In an embodiment, the wire 22c is disposed on the carrier 20 and is electrically connected with the circuit structures 200, with one end connected to the supporting portion 221, and the other end connected to the circuit structures 200. In an embodiment, the wire 22c and the circuit structures 200 can be manufactured simultaneously in an RDL process. It can be appreciated that the wire 22c can be two discontinuous line segments, wherein one segment is connected to the supporting portion 221, while the other segment is connected to the circuit structures 200.

In an embodiment, the supporting portion 221 can be used as a signal input terminal or a ground terminal, such that the electronic component 21 can be electrically connected with the extending portion 220 via at least a solder wire (not shown) as needed. The extending portion 220 and the wire 22c can both be used as antenna emitters, and the extending portion 220 is elevated by the supporting portion 221 to increase the emission intensity of the emitter. Thus, in terms of intensity, the extending portion 220 is greater than the wire 22c.

The buffer 25 is located on the second area B for covering the wire 22c, and is not electrically connected with the antenna structure 22, the electronic component 21, and the carrier 20.

In an embodiment, the buffer 25 is an insulator, and is made of a dielectric material, such as a ceramic material, with a dielectric constant (Er) between 5 and 15. For example, the ceramic material has the dielectric constant of about 10. In an embodiment, the buffer 25 is in contact with the antenna structure 22 but not electrically connected with the antenna structure 22, and is neither a conductor nor a semiconductor. It can be appreciated that if the buffer 25 is neither in contact with the antenna structure 22 nor electrically connected with the antenna structure 22, an insulator, a conductor or a semiconductor can be selected as the buffer 25.

Figure 3A:
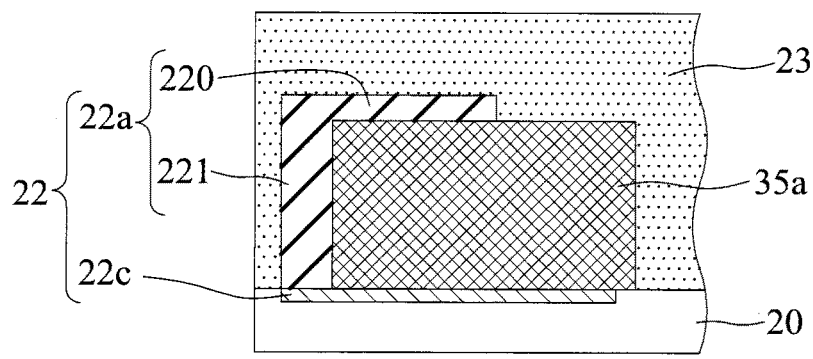
FIGS. 3A to 3C are cross-sectional views of FIG. 2C' in accordance with other embodiments of the present disclosure.

In an embodiment, the metal frame 22a is held over the carrier 20, and an accommodating space is formed between the extending portion 220 and the carrier 20 for accommodating the buffer 25 therein. The buffer 25 is located between the extending portion 220 and the wire 22c, and is not in contact with the extending portion 220. In another embodiment, as shown in FIG. 3A, the buffer 35a is in contact with the extending portion 220 of the metal frame 22a.

Figure 3B:
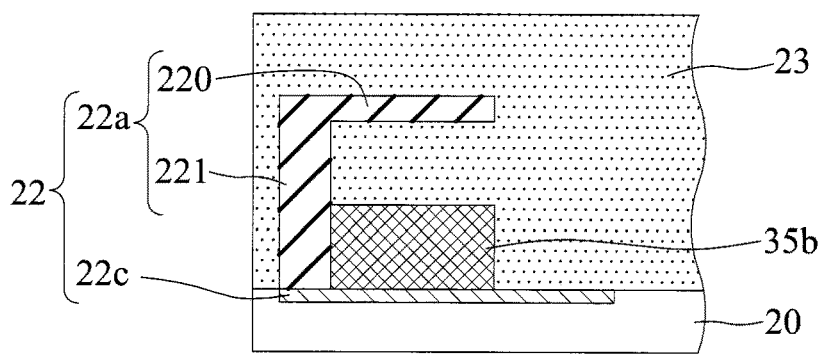

In an embodiment, the buffer 25 covers the entire wire 22c. However, in a manufacturing process, as shown in FIG. 3B, the buffer 35b covers only a portion of the wire 22c.

Figure 3C:
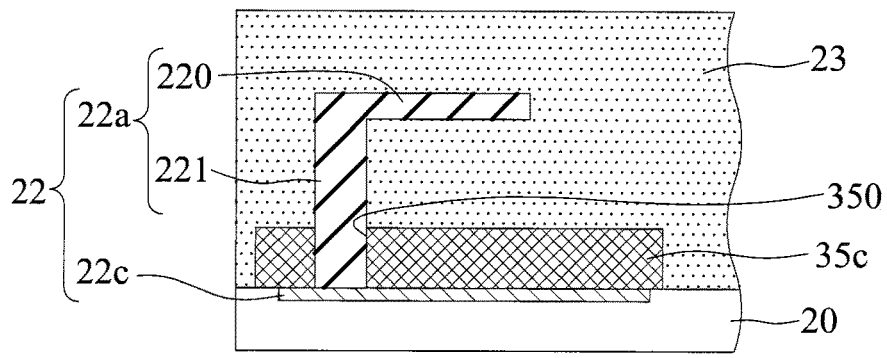

In another manufacturing process, as shown in FIG. 3C, the supporting portion 221 penetrates the buffer 35c. In an embodiment, the buffer 35c is formed with a through hole 350 for the supporting portion 221 to be inserted or filled therein.

As shown in FIG. 2B, an encapsulant 23 is formed on the carrier 20 to cover the electronic component 21, the antenna structure 22, and the buffer 25.

In an embodiment, the encapsulant 23 is made of polyimide (PI), a dry film, an epoxy resin, or molding compound, but the present disclosure is not limited to these.

As shown in FIG. 2C, a shield structure 24 is further formed on the encapsulant 23 to shield the electronic component 21.

In an embodiment, the shield structure 24 covers a portion of a surface of the encapsulant 23 and a portion of a side of the carrier 20. In other words, the shield structure 24 is formed only on the first area A of the carrier 20, but not on the antenna structure 22, and does not cover the antenna structure 22.

In an embodiment, the shield structure 24 is disposed on the encapsulant 23 by coating a metal layer (e.g., copper) using a sputtering, vaporing, electroplating, electroless plating or chemical plating process, for example. In another embodiment, the shield structure 24 is disposed on the encapsulant 23 by placing a metal frame or metal mask thereon or foiling. In yet another embodiment, a shield structure (e.g., a metal frame or a metal mask) is first disposed on the carrier 20 before encapsulating with the encapsulant 23, which would result in an appearance shown in FIG. 2B.

The shield structure 24 can selectively cover a vertical projection range of the first area A of the carrier 20, for example, all, ½, or ⅓ of it, or even selectively cover a portion or all of a side 20c of the first area A of the carrier 20.

In an embodiment, with the shield structure 24, the electronic component 21 is shielded from external electromagnetic interference. In another embodiment, the shield structure 24 is selected formed or not formed. In an embodiment, the shield structure 24 is needed in a case that the electronic component 21 is sensitive or the thickness of the encapsulant 23 is insufficient to the extent that the electronic component 21 is susceptible to electromagnetic interference.

In subsequent processes, a product utilizing the electronic package 2 can be formed into a tape shape, such as in the form of tape-on-reel.

As known from the positive correlation between wave speed and wavelength, i.e., when the wave speed is lowered, the wavelength is reduced. Therefore, with the buffer 25, 35a, 35b, 35c of the electronic package 2 covering the wire 22c, the emission wave speed of the wire 22c is effective reduced (slowed). This means that the emission wavelength of the wire 22c is also lowered. Compared to the prior art, under the limited space of the second area B of the carrier 20, the electrical length of the antenna structure 22 (or the wire 22c) is capable of satisfying the requirement for ¼ the wavelength without having to increase the length of the wire 22c in order for the antenna structure 22 to radiate at an operating frequency of 2.44 GHz.

Moreover, since the metal frame 22a is suspended over the carrier 20 resulting in a three-dimensional antenna body, an extra layout area is not needed on the surface of the carrier 20. Thus, compared to the prior art, the electronic package 2 is able to increase the length of the antenna structure 22 under the same size of the carrier 20, thereby achieving the operating requirements of the antenna while meeting the need for miniaturization of the electronic package 2.

Furthermore, the encapsulant 23 can be used to secure the metal frame 22a in place, so that the extending portion 220 maintains a fixed height and the stability of the antenna is ensured. The dielectric constant of the encapsulant 23 may be selected to advantageously reduce the electrical length required of the antenna structure 22.

By bending the metal plate to form the metal frame 22a and suspending the extending portion 220 over the carrier 20, the extending portion 220 may extend along the edge of the second area B. During the manufacturing process, the extending portion 220 can be manufactured at the same time as the electronic component 21, in other words, packaged simultaneously, such that the encapsulant 23 covers the electronic component 21, the buffer 25, 35a, 35b, 35c, and the antenna structure 22. As such, the mold used in the encapsulating process may correspond to the size of the carrier 20, which facilitates the packaging process.

The present disclosure further provides an electronic package 2, which includes: a carrier 20, an electronic component 21 disposed on the carrier 20, an antenna structure 22 disposed on the carrier 20, and a buffer 25, 35a, 35b, 35c disposed on the carrier 20.

The carrier 20 includes a plurality of circuit structures 200 electrically connected with the electronic component 21.

The electronic component 21 is electrically connected with the circuit structures 200 of the carrier 20.

The antenna structure 22 is electrically connected with the carrier 20, wherein the antenna structure 22 includes a metal frame 22a provided upright on the carrier 20 and at least one wire 22c provided on the carrier 20 and electrically connected with the metal frame 22a.

The buffer 25, 35a, 35b, 35c covers the wire 22c and is free from being electrically connected with the antenna structure 22.

In an embodiment, the antenna structure 22 is electrically connected with the carrier 20 via the wire 22c.

In an embodiment, the operating frequency of the antenna structure 22 is 2.44 GHz.

In an embodiment, the metal frame 22a includes an extending portion 220 and at least a supporting portion 221. The extending portion 220 is held over the carrier 20 by the supporting portion 221. In another embodiment, the buffer 25, 35a, 35b, 35c is located between the extending portion 220 and the antenna structure 22. In yet another embodiment, the supporting portion 221 penetrates the buffer 35c.

In an embodiment, the buffer 25, 35a, 35b, 35c is an insulator, and is made of a dielectric material with a dielectric constant between 5 and 15.

In an embodiment, the buffer 25, 35a, 35b, 35c is in contact with the supporting portion 221 of the metal frame 22a.

In an embodiment, the buffer 35a is in contact with the extending portion 220 of the metal frame 22a.

In an embodiment, the buffer 35*b* covers a portion of the wire 22*c*.

In an embodiment, the electronic package 2 further includes an encapsulant 23 formed on the carrier 20 for encapsulating the electronic component 21, the buffer 25, 35*a*, 35*b*, 35*c*, and the antenna structure 22.

In an embodiment, the electronic package 2 further includes a shield structure 24 disposed on the carrier 20 for covering the electronic component 21, without covering the antenna structure 22 and the buffer 25, 35*a*, 35*b*, 35*c*.

In an electronic package according to the present disclosure, as the buffer covers the wire, the emission wave speed of the wire is effective reduced (or slowed). This results in a decrease in the emission wavelength, and the antenna structure of the electronic package is thus able to radiate at the required operating frequency under the limited space of the carrier.

Furthermore, the prior-art flat planar antenna structure is replaced by a higher-profile antenna structure, and the length of the antenna structure can be increased without costing extra layout area on the surface of the carrier, thereby satisfying the requirements of the antenna.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
    a carrier;
    at least one electronic component disposed on the carrier;
    an antenna structure disposed on and electrically connected with the carrier, wherein the antenna structure includes a metal frame provided upright on the carrier and a wire provided on the carrier and electrically connected with the metal frame;
    a buffer covering the wire and free from being electrically connected with the antenna structure, wherein the buffer is an insulator to slow an emission wave speed of the wire, and the buffer is free from covering the electronic component; and
    an encapsulant formed on the carrier and covering the electronic component, the buffer, and the antenna structure.

2. The electronic package of claim 1, wherein the antenna structure is electrically connected with the carrier via the wire.

3. The electronic package of claim 1, wherein the antenna structure has an operating frequency of 2.44 GHz.

4. The electronic package of claim 1, wherein the metal frame includes at least one supporting portion and an extending portion held over the carrier by the supporting portion.

5. The electronic package of claim 4, wherein the buffer is positioned between the extending portion and the wire.

6. The electronic package of claim 4, wherein the supporting portion penetrates the buffer.

7. The electronic package of claim 1, wherein the buffer is made of a dielectric material.

8. The electronic package of claim 7, wherein the dielectric material has a dielectric constant between 5 and 15.

9. The electronic package of claim 1, wherein the buffer is in contact with the metal frame.

10. The electronic package of claim 1, wherein the buffer covers a portion of the wire.

11. The electronic package of claim 1, wherein the buffer covers entirety of the wire.

12. The electronic package of claim 1, further comprising a shield structure disposed on the carrier and covering the electronic component.

* * * * *